United States Patent
Lombardo et al.

(10) Patent No.: US 11,616,509 B1
(45) Date of Patent: Mar. 28, 2023

(54) PROGRAMMABLE DYNAMIC ELEMENT MATCHING ENCODER FOR A DIGITAL-TO-ANALOG CONVERTER (DAC) AND METHOD OF PROGRAMMING FOR A PLURALITY OF SAMPLING INTERVALS

(71) Applicant: Infineon Technologies AG, Neubiberg (DE)

(72) Inventors: Francesco Lombardo, Munich (DE); Dmytro Cherniak, Villach (AT); Luigi Grimaldi, Villach (AT); Nicolo Guarducci, Linz (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/534,646

(22) Filed: Nov. 24, 2021

(51) Int. Cl.
*H03M 1/06* (2006.01)

(52) U.S. Cl.
CPC ................. *H03M 1/0668* (2013.01)

(58) Field of Classification Search
CPC .................................................. H03M 1/0668
See application file for complete search history.

(56) References Cited

U.S. PATENT DOCUMENTS

| | | | | |
|---|---|---|---|---|
| 6,266,002 B1* | 7/2001 | Gong | ................. | H03M 1/0668 341/150 |
| 7,446,688 B1* | 11/2008 | Yau | ..................... | H03M 1/0665 341/147 |
| 8,935,689 B2* | 1/2015 | Evans | ..................... | G06F 8/654 711/100 |
| 2012/0259602 A1* | 10/2012 | Nishiura | ................. | G06F 30/20 703/6 |
| 2013/0013613 A1* | 1/2013 | Sharma | .................. | G06Q 10/06 707/E17.084 |
| 2014/0077873 A1 | 3/2014 | Motz et al. | | |
| 2015/0381198 A1 | 12/2015 | Lasseuguette et al. | | |
| 2019/0103880 A1 | 4/2019 | Chen et al. | | |
| 2019/0190535 A1 | 6/2019 | Tsinker | | |
| 2020/0193701 A1* | 6/2020 | Ely | ..................... | G06V 10/751 |

FOREIGN PATENT DOCUMENTS

JP 2017191518 A 10/2017

* cited by examiner

*Primary Examiner* — Lam T Mai
(74) *Attorney, Agent, or Firm* — Harrity & Harrity, LLP

(57) ABSTRACT

A dynamic element matching (DEM) encoder is provided that converts an N-bit digital codeword into a pattern of 1-bit values. The DEM encoder includes a binary switching tree that includes plurality of switching blocks interconnected between an encoder input and a plurality of encoder outputs. The plurality of switching blocks are configured to receive a plurality of first control signals such that each switching block receives a respective first control signal and is independently programmable based on the respective first control signal into a first mode or a second mode. Each switching block includes a splitting circuit programmed into the first mode or the second mode to split a digital input into two digital outputs using either both a first splitting operation and a second splitting operation that is different from the first splitting operation or the first splitting operation over the plurality of sampling intervals.

26 Claims, 7 Drawing Sheets

PROGRAMMABLE DYNAMIC ELEMENT MATCHING ENCODER FOR A DIGITAL-TO-ANALOG CONVERTER (DAC) AND METHOD OF PROGRAMMING FOR A PLURALITY OF SAMPLING INTERVALS

BACKGROUND

A digital-to-analog converter (DAC) is used to bridge the digital domain and the analog domain in many applications that require high speed, low cost, and high-resolution data. In the context of modern radio-frequency (RF) systems employing DACs, a typical problem is represented by high-linearity requirements that is often difficult to achieve, especially in light of mismatches between individual components of the circuit, which result from production spread, tolerances, and other factors such as layout. This results in high-order non-linearity. Dynamic Element Matching (DEM) is a technique which scrambles the usage pattern of the DAC's circuit elements, thereby causing the error resulting from the mismatches to be pseudorandom noise that is uncorrelated with the input sequence instead of non-linear distortion. In other words, DEM results in a conversion of the non-linear distortion into noise.

Often however, existing DEM techniques face limitations to the achievable performance, partly due to the fact that a DEM encoder is blind to the mismatches it addresses, and to other sources of degradation, such as couplings and additional mismatches.

This is particularly evident in one specific DAC embodiment, a Digital-Controlled Oscillator (DCO) that can be employed in a Digital Phase Locked Loop (DPLL) where the DCO converts an input digital control word into a frequency. Here, the 1-bit DAC elements are individual capacitive cells of the DCO and a mismatch can occur between different cells from multiple error sources that include mismatches in capacitances, routing, and timing.

In particular, existing solutions, although addressing the mismatch between cells, generate a pattern for the number of DEM cells that transition from one splitting scheme to another splitting scheme (i.e., referred herein as the "number of transitions") versus the input digital control word, with very sharp profile (e.g., a triangular-shaped profile). Combined with physical non-idealities in the DAC, such as asymmetric ON-OFF vs OFF-ON timing of one cell, supply pushing, among others, a temporary incorrect DAC output (frequency) can be selected by the DCO, which causes a data dependent average error at the output. The error is data dependent because the number of transitions, which is a multiplier for this average error, depends sharply on the control word of the DAC. In other words, the data dependent frequency error is proportional to the number of transitions in the DEM encoder.

Therefore, an improved DEM encoder capable of providing a programmable profile with respect to a number of transitions versus the input digital control word for providing a smoother profile may be desirable.

SUMMARY

One or more embodiments provide a dynamic element matching (DEM) encoder configured to convert an N-bit digital codeword into a pattern of 1-bit values, wherein N is an integer greater than one. The DEM encoder includes: a binary switching tree including an encoder input configured to receive the N-bit digital codeword and a plurality of encoder outputs, wherein each encoder output is configured to output one 1-bit value of the pattern of 1-bit values, wherein the binary switching tree includes a plurality of switching blocks interconnected between the encoder input and the plurality of encoder outputs, wherein the plurality of switching blocks are configured to receive a plurality of first control signals such that each switching block receives a respective first control signal of the plurality of first control signals and is independently programmable based on the respective first control signal, wherein each switching block of the plurality of switching blocks includes a block input terminal, a first block output terminal, a second block output terminal, and a switching control input terminal configured to receive the respective first control signal configured to program a respective switching block into a first mode or second mode for a plurality of sampling intervals, wherein the block input terminal is configured to receive a respective digital input derived from the N-bit digital codeword, wherein each switching block includes a splitting circuit configured to split the respective digital input into a respective first digital output for the first block output terminal and a respective second digital output for the second block output terminal according to a first splitting operation or a second splitting operation that is different from the first splitting operation, wherein, in the first mode the splitting circuit is configured to switch between the first splitting operation and the second splitting operation over the plurality of sampling intervals to generate the respective first digital output and the respective second digital output, and wherein, in the second mode, the splitting circuit is configured to generate the respective first digital output and the respective second digital output according to the first splitting operation over the plurality of sampling intervals, without switching between the first splitting operation and the second splitting operation.

One or more embodiments provide a dynamic element matching (DEM) encoder configured to convert an N-bit digital codeword into a pattern of 1-bit values, wherein N is an integer greater than one. The DEM encoder includes: a binary switching tree including an encoder input configured to receive the N-bit digital codeword and a plurality of encoder outputs, wherein each encoder output is configured to output one 1-bit value of the pattern of 1-bit values, wherein the binary switching tree includes a plurality of switching blocks interconnected between the encoder input and the plurality of encoder outputs, wherein the plurality of switching blocks are configured to receive a plurality of first control signals such that each switching block receives a respective first control signal of the plurality of first control signals and is programmable based on the respective first control signal, wherein each switching block of the plurality of switching blocks includes a block input terminal, a first block output terminal, and a second block output terminal, wherein the block input terminal is configured to receive a respective digital input derived from the N-bit digital codeword, wherein each switching block includes a splitting circuit configured to split the respective digital input into a respective first digital output for the first block output terminal and a respective second digital output for the second block output terminal according to a first splitting operation or a second splitting operation that is different from the first splitting operation, wherein each switching block includes a toggling circuit configured to generate a toggle bit whose value toggles during the plurality of sampling intervals, wherein the splitting circuit is configured to receive the toggle bit and apply the first splitting operation or the second splitting operation according to the value of the toggle bit, wherein each switching block includes a dithering circuit including a dithering control input terminal configured to receive the respective first control signal that indicates whether dithering is enabled or disabled for the plurality of sampling intervals for that switching block, and wherein the dithering circuit is configured to inject a respective dithering pattern into the toggling circuit when dithering is enabled and refrain from injecting the respective dithering pattern into the toggling circuit when dithering is disabled.

One or more embodiments provide a dynamic element matching (DEM) encoder configured to convert an N-bit digital codeword into a pattern of 1-bit values, wherein N is an integer greater than one. The DEM encoder includes: a binary switching tree including an encoder input configured to receive the N-bit digital codeword and a plurality of encoder outputs, wherein each encoder output is configured to output one 1-bit value of the pattern of 1-bit values, wherein the binary switching tree includes a plurality of switching blocks interconnected between the encoder input and the plurality of encoder outputs, wherein the plurality of switching blocks are configured to receive a plurality of first control signals such that each switching block receives a respective first control signal of the plurality of first control signals and is independently programmable based on the respective first control signal, wherein each switching block of the plurality of switching blocks includes a block input terminal, a first block output terminal, a second block output terminal, and a switching control input terminal configured to receive the respective first control signal configured to program a respective switching block into a first mode or second mode for a plurality of sampling intervals, wherein the block input terminal is configured to receive a respective digital input derived from the N-bit digital codeword, wherein each switching block includes a splitting circuit configured to split the respective digital input into a respective first digital output for the first block output terminal and a respective second digital output for the second block output terminal according to a first splitting operation, a second splitting operation that is opposite to the first splitting operation, or a third splitting operation, wherein, when in the first mode, the splitting circuit is configured to switch between the first splitting operation, the second splitting operation, and the third splitting operation over the plurality of sampling intervals to generate the first digital output and the second digital output, and wherein, when in the second mode, the splitting circuit is configured to generate the first digital output and the second digital output according to the first splitting operation and the third splitting operation over the plurality of sampling intervals.

BRIEF DESCRIPTION OF THE DRAWINGS

Embodiments are described herein making reference to the appended drawings.

DETAILED DESCRIPTION

Figure 1A:
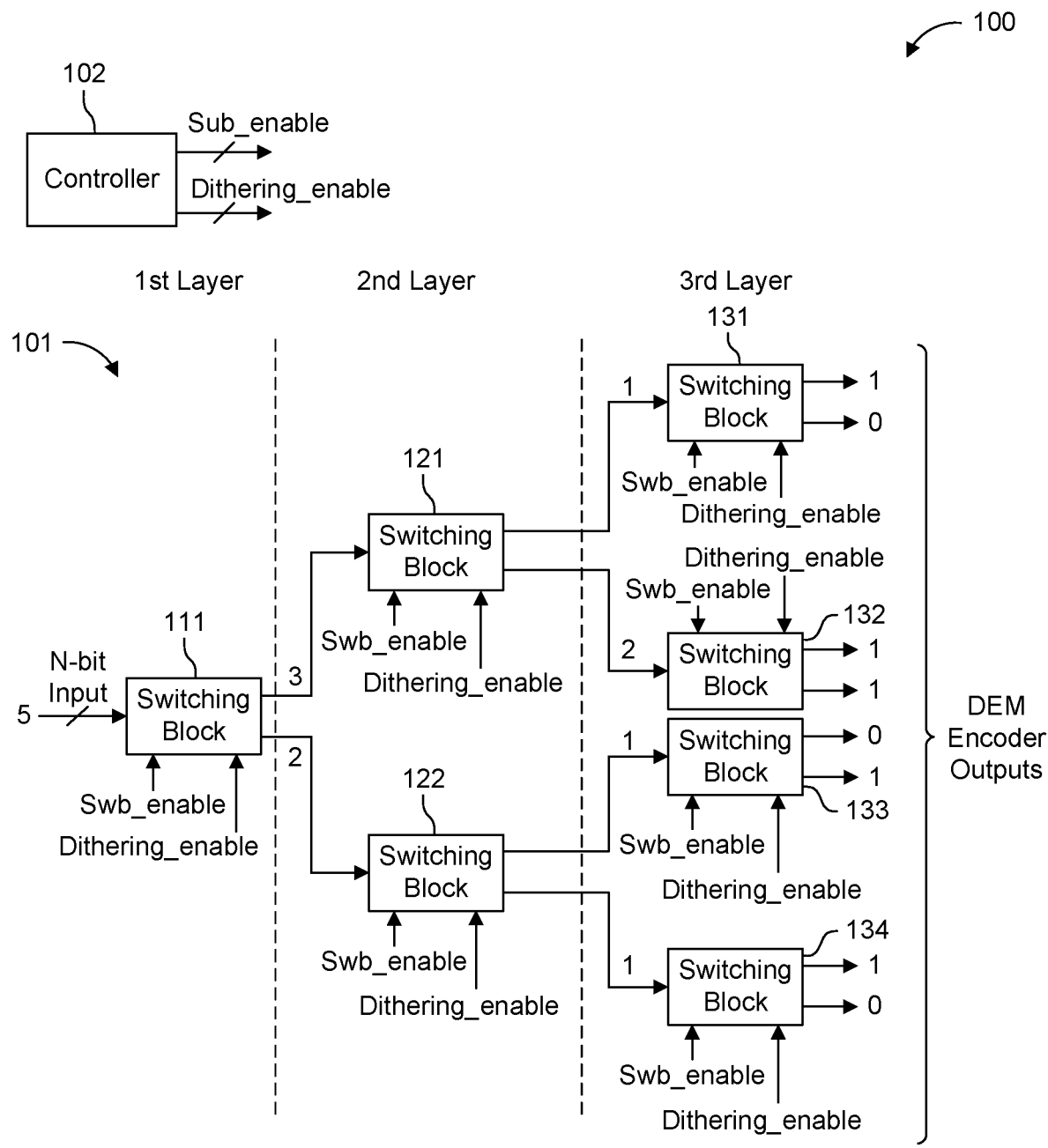
FIG. 1A is a schematic block diagram of a Dynamic Element Matching (DEM) encoder according to one or more embodiments.

In the following, details are set forth to provide a more thorough explanation of the exemplary embodiments. However, it will be apparent to those skilled in the art that embodiments may be practiced without these specific details. In other instances, well-known structures and devices are shown in block diagram form or in a schematic view rather than in detail in order to avoid obscuring the embodiments. In addition, features of the different embodiments described hereinafter may be combined with each other, unless specifically noted otherwise.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually exchangeable.

In this regard, directional terminology, such as "top", "bottom", "below", "above", "front", "behind", "back", "leading", "trailing", etc., may be used with reference to the orientation of the figures being described. Because parts of embodiments can be positioned in a number of different orientations, the directional terminology is used for purposes of illustration. It is to be understood that other embodiments may be utilized and structural or logical changes may be made without departing from the scope defined by the claims. The following detailed description, therefore, is not to be taken in a limiting sense. Directional terminology used in the claims may aid in defining one element's spatial or positional relation to another element or feature, without being limited to a specific orientation.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In embodiments described herein or shown in the drawings, any direct electrical connection or coupling, i.e., any connection or coupling without additional intervening elements, may also be implemented by an indirect connection or coupling, i.e., a connection or coupling with one or more additional intervening elements, or vice versa, as long as the general purpose of the connection or coupling, for example, to transmit a certain kind of signal or to transmit a certain kind of information, is essentially maintained. Features from different embodiments may be combined to form further embodiments. For example, variations or modifications described with respect to one of the embodiments may also be applicable to other embodiments unless noted to the contrary.

The term "substantially" may be used herein to account for small manufacturing tolerances (e.g., within 5%) that are deemed acceptable in the industry without departing from the aspects of the embodiments described herein.

In the present disclosure, expressions including ordinal numbers, such as "first", "second", and/or the like, may modify various elements. However, such elements are not limited by the above expressions. For example, the above expressions do not limit the sequence and/or importance of the elements. The above expressions are used merely for the purpose of distinguishing an element from the other elements. For example, a first box and a second box indicate different boxes, although both are boxes. For further example, a first element could be termed a second element, and similarly, a second element could also be termed a first element without departing from the scope of the present disclosure.

FIG. 1A is a schematic block diagram of a Dynamic Element Matching (DEM) encoder 100 according to one or more embodiments. The DEM encoder 100 includes a binary switching tree 101 and may further include a controller 102 that generates control signals swb_enable and dithering_enable. Alternatively, the controller 102 may be located external to the DEM encoder 100. The DEM encoder 100 is configured to convert an N-bit digital codeword (i.e., an N-bit input, where N is an integer greater than one) into a pattern of 1-bit values at its outputs. In this example, the N-bit digital codeword is a 3-bit digital codeword having a digital value of 5 (e.g., 101), but is not limited thereto.

The binary switching tree 101 includes plurality of switching blocks 111, 121, 122, 131, 132, 133, and 134 interconnected between an encoder input and a plurality of encoder outputs. The switching blocks 111, 121, 122, 131, 132, 133, and 134 are arranged into N layers (e.g., $1^{st}$, $2^{nd}$, and $3^{rd}$ layers) with each subsequent layer including twice as many switching blocks as the previous layer. Here, the first switching block 111 includes the encoder input of the binary switching tree 101 that is configured to receive the N-bit digital codeword. The last switching blocks 131, 132, 133, and 134 of the of the binary switching tree 101 include the plurality of encoder outputs, the sum of which equals the digital value of the N-bit digital codeword. Each switching block of the binary switching tree 101 includes a single data input and two data outputs and is configured to split its data input (e.g., by division) into to divided data output values. For example, in the present example, the N-bit digital codeword having a digital value of 5 is split by switching block 111 into one data output having a digital value of 3 and another data output having a digital value of 2. Even digital values are split evenly between its outputs, such as the case for switching block 122.

The divided output values generated by the switching blocks in the $1^{st}$ and $2^{nd}$ layers are provide as data input values to a respective switching block of the next layer. The divided output values generated by the switching blocks in the $3^{rd}$ layer are provided as the outputs of the DEM encoder 100, which may be subsequently fed into a DAC or a DCO. Accordingly, the DEM encoder 100 is configured to convert an N-bit digital codeword into a pattern of 1-bit values. The binary switching tree 101 includes an encoder input configured to receive the N-bit digital codeword and a plurality of encoder outputs, where each encoder output is configured to output one 1-bit value of the pattern of 1-bit values. The 1-bit values are out in parallel to each other.

The plurality of switching blocks 111, 121, 122, 131, 132, 133, and 134 are configured to receive a plurality of first control signals (swb_enable) such that each switching block receives a respective first control signal of the plurality of first control signals and is independently programmable based on the respective first control signal. The first control signals (swb_enable) are used to place each switching block into either a first mode (i.e., a toggling mode or scrambling mode) or second mode (i.e., a non-toggling mode or non-scrambling mode). Each switching block 111, 121, 122, 131, 132, 133, and 134 is configured to receive a different one of the first control signals, thereby making the mode of each switching block independently programmable from the other switching blocks.

The controller 102 is configured to generate the plurality of first control signals (swb_enable) to selectively program a first subset of switching blocks of the plurality of switching blocks into the first mode for a plurality of sampling intervals and selectively program a second subset of switching blocks of the plurality of switching blocks into the second mode for the plurality of sampling intervals in order to shape a profile of a number of transitions versus N-bit digital codewords.

"A plurality of sampling intervals" may refer to a plural number of N-bit digital codewords that are "sampled" for conversion into the pattern of 1-bit values before the controller generates a new set of first control signals. Alternatively, it may refer to an operating mode during which the plurality of switching blocks are fixed into their respective first or second mode for the conversion of all N-bit digital codewords received by the DEM encoder 100 during that operating mode.

In some aspects, the techniques described herein relate to a dynamic element matching (DEM) encoder configured to convert an N-bit digital codeword into a pattern of 1-bit values, wherein N is an integer greater than one, the DEM encoder including: a binary switching tree including an encoder input configured to receive the N-bit digital codeword and a plurality of encoder outputs, wherein each encoder output is configured to output one 1-bit value of the pattern of 1-bit values, wherein the binary switching tree includes a plurality of switching blocks interconnected between the encoder input and the plurality of encoder outputs, wherein the plurality of switching blocks are configured to receive a plurality of first control signals such that each switching block receives a respective first control signal of the plurality of first control signals and is independently programmable based on the respective first control signal, wherein each switching block of the plurality of switching blocks includes a block input terminal, a first block output terminal, a second block output terminal, and a switching control input terminal configured to receive the respective first control signal configured to program a respective switching block into a first mode or second mode for a plurality of sampling intervals, wherein the block input terminal is configured to receive a respective digital input derived from the N-bit digital codeword, wherein each switching block includes a splitting circuit configured to split the respective digital input into a respective first digital output for the first block output terminal and a respective second digital output for the second block output terminal according to a first splitting operation or a second splitting operation that is different from the first splitting operation, wherein, in the first mode the splitting circuit is configured to switch between the first splitting operation and the second splitting operation over the plurality of sampling intervals to generate the respective first digital output and the respective second digital output, and wherein, in the second mode, the splitting circuit is configured to generate the respective first digital output and the respective second digital output according to the first splitting operation over the plurality of sampling intervals, without switching between the first splitting operation and the second splitting operation.

In some aspects, the techniques described herein relate to a DEM encoder, wherein: each switching block includes a toggling circuit configured to generate a toggle bit whose value toggles during the plurality of sampling intervals, and when in the first mode, the splitting circuit is configured to receive the toggle bit and apply the first splitting operation or the second splitting operation according to the value of the toggle bit.

In some aspects, the techniques described herein relate to a DEM encoder, wherein: the splitting circuit is configured to receive the toggle bit when in the first mode and receive a lowest significant bit (LSB) of the respective digital input when in the second mode, and when in the second mode, the splitting circuit is configured to apply the first splitting operation using the LSB to generate the respective first digital output and the respective second digital output.

In some aspects, the techniques described herein relate to a DEM encoder, wherein: when in the second mode, the splitting circuit is configured to receive the LSB instead of the toggle bit, and when in the first mode, the splitting circuit is configured to receive the toggle bit instead of the LSB.

In some aspects, the techniques described herein relate to a DEM encoder, further including: a controller configured to generate the plurality of first control signals to selectively program a first subset of switching blocks of the plurality of switching blocks into the first mode for the plurality of sampling intervals and selectively program a second subset of switching blocks of the plurality of switching blocks into the second mode for the plurality of sampling intervals in order to shape a profile of a number of transitions versus N-bit digital codewords.

In some aspects, the techniques described herein relate to a DEM encoder, wherein the controller is configured to program the first subset of switching blocks into the first mode and selectively program the second subset of switching blocks into the second mode such that the shape of the profile of the number of transitions versus the N-bit digital codewords is smooth.

In some aspects, the techniques described herein relate to a DEM encoder, wherein: the first splitting operation includes adding 1 to the respective digital input to generate a first value and dividing the first value by 2 to generate the respective first digital output, the first splitting operation further includes subtracting 1 from the respective digital input to generate a second value and dividing the second value by 2 to generate the respective second digital output, the second splitting operation includes subtracting 1 from the respective digital input to generate a third value and dividing the third value by 2 to generate the respective first digital output, and the second splitting operation further includes adding 1 to the respective digital input to generate a fourth value and dividing the fourth value by 2 to generate the respective second digital output.

In some aspects, the techniques described herein relate to a DEM encoder, wherein each switching block includes a toggling circuit configured to generate a toggle bit that toggles between 1, 0, and −1 depending on a lowest significant bit (LSB) of the respective digital input, wherein, when in the first mode, the splitting circuit is configured to receive the toggle bit and apply the first splitting operation when the toggle bit is 1 and apply the second splitting operation when the toggle bit is −1.

In some aspects, the techniques described herein relate to a DEM encoder, wherein the splitting circuit of each switching block is configured to perform a third splitting operation when the LSB of the respective digital input is 0, including splitting the respective digital input evenly into the respective first digital output and the respective second digital output.

In some aspects, the techniques described herein relate to a DEM encoder, wherein, when in the first mode, the splitting circuit is configured to receive the toggle bit, add 1 to the respective digital input when the toggle bit is 1 to generate the first value, add 0 to the respective digital input when the toggle bit is 0 to generate the first value, subtract 1 from the respective digital input when the toggle bit is 1 to generate the second value, and subtract 0 from the respective digital input when the toggle bit is 0 to generate the second value.

In some aspects, the techniques described herein relate to a DEM encoder, wherein: when in the second mode, the splitting circuit is configured to receive a lowest significant bit (LSB) of the respective digital input, add 1 to the respective digital input when the LSB is 1 to generate the first value, add 0 to the respective digital input when the LSB is 0 to generate the first value, subtract 1 from the respective digital input when the LSB is 1 to generate the second value, and subtract 0 from the respective digital input when the LSB is 0 to generate the second value.

In some aspects, the techniques described herein relate to a DEM encoder, wherein the toggling circuit is a first order feedback loop configured to generate the toggle bit based on at least one previous toggle bit and the LSB.

In some aspects, the techniques described herein relate to a DEM encoder, wherein: the plurality of switching blocks are configured to receive a plurality of second control signals such that each switching block receives a respective second control signal of the plurality of second control signals and is programmable based on the respective second control signal, each switching block includes a dithering circuit including a dithering control input configured to receive the respective second control signal that indicates whether dithering is enabled or disabled for the plurality of sampling intervals for that switching block, and the dithering circuit is configured to inject a respective dithering pattern into the toggling circuit when dithering is enabled and not inject the respective dithering pattern into the toggling circuit when dithering is disabled.

In some aspects, the techniques described herein relate to a DEM encoder, further including: a controller configured generate the plurality of second control signals to concurrently selectively enable dithering at a first subset of switching blocks of the plurality of switching blocks over the plurality of sampling intervals and selectively disable dithering at a second subset of switching blocks of the plurality of switching blocks over the plurality of sampling intervals.

In some aspects, the techniques described herein relate to a DEM encoder, further including: a plurality of random number generators configured to generate a plurality of random sequences, wherein each dithering circuit is configured to receive a respective random sequence of the plurality of random sequences, generate the respective dithering pattern based on the respective random sequence, and output the respective dithering pattern to the toggling circuit on a condition that dithering is enabled.

In some aspects, the techniques described herein relate to a DEM encoder, wherein a number of the plurality of random number generators is equal to a number of the plurality of switching blocks, and each switching block is connected to a different random number generator of the plurality of random number generators such that the plurality of random number generators and the plurality of switching blocks are connected on a one-to-one basis.

In some aspects, the techniques described herein relate to a DEM encoder, wherein: a number of the plurality of random number generators is less than a number of the plurality of switching blocks, wherein the plurality of random number generators includes a first random number generator connected to a first subset of switching blocks of the plurality of switching blocks for transmitting a first random sequence thereto, and the plurality of random number generators includes a second random number generator connected to a second subset of switching blocks of the plurality of switching blocks for transmitting a second random sequence thereto, wherein the first subset of switching blocks and the second subset of switching blocks are mutually exclusive.

In some aspects, the techniques described herein relate to a DEM encoder, wherein the plurality of encoder outputs is configured to output the pattern of 1-bit values to at least one of a Digital-to-Analog Converter (DAC) or a Digital-controlled Oscillator (DCO).

In some aspects, the techniques described herein relate to a dynamic element matching (DEM) encoder configured to convert an N-bit digital codeword into a pattern of 1-bit values, wherein N is an integer greater than one, the DEM encoder including: a binary switching tree including an encoder input configured to receive the N-bit digital codeword and a plurality of encoder outputs, wherein each encoder output is configured to output one 1-bit value of the pattern of 1-bit values, wherein the binary switching tree includes a plurality of switching blocks interconnected between the encoder input and the plurality of encoder outputs, wherein the plurality of switching blocks are configured to receive a plurality of first control signals such that each switching block receives a respective first control signal of the plurality of first control signals and is programmable based on the respective first control signal, wherein each switching block of the plurality of switching blocks includes a block input terminal, a first block output terminal, and a second block output terminal, wherein the block input terminal is configured to receive a respective digital input derived from the N-bit digital codeword, wherein each switching block includes a splitting circuit configured to split the respective digital input into a respective first digital output for the first block output terminal and a respective second digital output for the second block output terminal according to a first splitting operation or a second splitting operation that is different from the first splitting operation, wherein each switching block includes a toggling circuit configured to generate a toggle bit whose value toggles during the plurality of sampling intervals, wherein the splitting circuit is configured to receive the toggle bit and apply the first splitting operation or the second splitting operation according to the value of the toggle bit, wherein each switching block includes a dithering circuit including a dithering control input terminal configured to receive the respective first control signal that indicates whether dithering is enabled or disabled for the plurality of sampling intervals for that switching block, and wherein the dithering circuit is configured to inject a respective dithering pattern into the toggling circuit when dithering is enabled and refrain from injecting the respective dithering pattern into the toggling circuit when dithering is disabled.

In some aspects, the techniques described herein relate to a DEM encoder, further including: a controller configured generate the plurality of first control signals to selectively enable dithering at a first subset of switching blocks of the plurality of switching blocks over the plurality of sampling intervals and selectively disable dithering at a second subset of switching blocks of the plurality of switching blocks over the plurality of sampling intervals.

In some aspects, the techniques described herein relate to a DEM encoder, further including: a plurality of random number generators configured to generate a plurality of random sequences, wherein each dithering circuit is configured to receive a respective random sequence of the plurality of random sequences, generate the respective dithering pattern based on the respective random sequence, and output the respective dithering pattern to the toggling circuit on a condition that dithering is enabled.

In some aspects, the techniques described herein relate to a DEM encoder, wherein a number of the plurality of random number generators is equal to a number of the plurality of switching blocks, and each switching block is connected to a different random number generator of the plurality of random number generators such that the plurality of random number generators and the plurality of switching blocks are connected on a one-to-one basis.

In some aspects, the techniques described herein relate to a DEM encoder, wherein: a number of the plurality of random number generators is less than a number of the plurality of switching blocks, wherein the plurality of random number generators includes a first random number generator connected to a first subset of switching blocks of the plurality of switching blocks for transmitting a first random sequence thereto, and the plurality of random number generators includes a second random number generator connected to a second subset of switching blocks of the plurality of switching blocks for transmitting a second random sequence thereto, wherein the second subset of switching blocks is different from the first subset of switching blocks.

In some aspects, the techniques described herein relate to a dynamic element matching (DEM) encoder configured to convert an N-bit digital codeword into a pattern of 1-bit values, wherein N is an integer greater than one, the DEM encoder including: a binary switching tree including an encoder input configured to receive the N-bit digital codeword and a plurality of encoder outputs, wherein each encoder output is configured to output one 1-bit value of the pattern of 1-bit values, wherein the binary switching tree includes a plurality of switching blocks interconnected between the encoder input and the plurality of encoder outputs, wherein the plurality of switching blocks are configured to receive a plurality of first control signals such that each switching block receives a respective first control signal of the plurality of first control signals and is independently programmable based on the respective first control signal, wherein each switching block of the plurality of switching blocks includes a block input terminal, a first block output terminal, a second block output terminal, and a switching control input terminal configured to receive the respective first control signal configured to program a respective switching block into a first mode or second mode for a plurality of sampling intervals, wherein the block input terminal is configured to receive a respective digital input derived from the N-bit digital codeword, wherein each switching block includes a splitting circuit configured to split the respective digital input into a respective first digital output for the first block output terminal and a respective second digital output for the second block output terminal according to a first splitting operation, a second splitting operation that is opposite to the first splitting operation, or a third splitting operation, wherein, when in the first mode, the splitting circuit is configured to switch between the first splitting operation, the second splitting operation, and the third splitting operation over the plurality of sampling intervals to generate the first digital output and the second digital output, and wherein, when in the second mode, the splitting circuit is configured to generate the first digital output and the second digital output according to the first splitting operation and the third splitting operation over the plurality of sampling intervals.

In some aspects, the techniques described herein relate to a DEM encoder, wherein: in the first mode, the splitting circuit is configured to receive a toggle bit and apply the first splitting operation, the second splitting operation, or the third splitting operation based on the toggle bit to generate the first digital output and the second digital output, and in the second mode, the splitting circuit is configured to receive a lowest significant bit (LSB) of the respective digital input and apply the first splitting operation or the third splitting operation based on the LSB to generate the first digital output and the second digital output.

In some aspects, the techniques described herein relate to a DEM encoder, wherein the plurality of encoder outputs is configured to output the pattern of 1-bit values to at least one of a Digital-to-Analog Converter (DAC) or a Digital-controlled Oscillator (DCO) for conversion into an analog signal. Additionally, or alternatively, the plurality of encoder outputs may be used as control signals (e.g., control bits) for controlling discrete components of the DAC or the DCO in order for the DAC or DCO to generate an analog signal in accordance with those control signals.

"A number of transitions" refers to the number of encoder outputs that toggle over subsequent sampling intervals as a result of the first subset of switching blocks that toggle their outputs based on a toggling operation. In particular, this depends on the number of switching blocks that are not only configured in the first mode but those that transition from applying the first splitting operation to its input to applying the second splitting operation to its input or vice versa. The number of switching blocks that swap between these two splitting operations is dependent on the digital value of the N-bit digital codeword. For example, the largest number of transitions occurs at a digital value of 128 for an 8-bit digital codeword. In contrast, the switching blocks in the second subset of switching blocks do not toggle their outputs based on a toggling operation. Thus, by configuring the size of the first subset of switching blocks, the number of transitions can be configured as well (e.g., by reducing the size of the first subset, the number of transitions can be reduced).

The pattern of the number of transitions versus the input N-bit digital codeword can be shaped not only by configuring the size of the first subset of switching blocks but also by selecting the location within the binary switching tree 101 at which output toggling is enabled. In other words, the location of the individual switching blocks configured into the first mode and the location of the individual switching blocks configured into the second mode impacts the shape of the pattern of the number of transitions versus the input N-bit digital codeword and this pattern can be shaped by selectively configuring the switching blocks into either the first mode or the second mode. The controller 102 may be configured to program the first subset of switching blocks into the first mode and selectively program the second subset of switching blocks into the second mode such that the shape of the profile of number of transitions versus the N-bit digital codeword is fitting a desired pattern. In some cases, the desired pattern may provide a smooth transition profile or a parabolic transition profile.

The plurality of switching blocks 111, 121, 122, 131, 132, 133, and 134 are configured to receive a plurality of second control signals (dithering_enable) such that each switching block receives a respective second control signal of the plurality of second control signals and is programmable based on the respective second control signal. The plurality of second control signals may be generated independently of each other such that each switching block independently programmable from the other switching blocks. Alternatively, the switching blocks 111, 121, 122, 131, 132, 133, and 134 may be arranged into one or more groups, with each group receiving a different one of the second control signals (dithering_enable). Each second control signal (dithering_enable) indicates whether dithering is enabled or disabled for the plurality of sampling intervals for a respective switching block.

The controller 102 is configured to generate the plurality of second control signals (dithering_enable) to concurrently selectively enable dithering at a first subset of switching blocks of the plurality of switching blocks over the plurality of sampling intervals and selectively disable dithering at a second subset of switching blocks of the plurality of switching blocks over the plurality of sampling intervals. The first and second subsets of switching blocks for dithering are not necessarily the same as the first and second subsets of switching blocks for toggling modes (i.e., first and second modes). Thus, dithering and toggling mode settings need not be dependent on each other.

Each switching block of the plurality of switching blocks 111, 121, 122, 131, 132, 133, and 134 includes a block input terminal configured to receive a respective digital input derived from the N-bit digital codeword, a first block output terminal (e.g., a top output), a second block output terminal (e.g., a bottom output), and a switching control input terminal configured to receive the respective first control signal (swb_enable) configured to program a respective switching block into a first mode or second mode for a plurality of sampling intervals, and a dithering control input configured to receive the respective second control signal (dithering_enable) that indicates whether dithering is enabled or disabled for the plurality of sampling intervals for that switching block.

Each switching block 111, 121, 122, 131, 132, 133, and 134 includes a splitting circuit configured to split its respective digital input into a respective first digital output for the first block output terminal and a respective second digital output for the second block output terminal according to a first splitting operation or a second splitting operation that is different from the first splitting operation. In particular, when configured into the first mode, the splitting circuit is configured to switch between the first splitting operation and the second splitting operation over the plurality of sampling intervals to generate the respective first digital output and the respective second digital output. For example, the first splitting operation performed by the first switching block 111 may result in its digital input having a value of 5 being split into digital values of 3 for its top output and 2 for its bottom output. In contrast, the second splitting operation performed by the first switching block 111 may result in its digital input having a value of 5 being split into digital values of 2 for its top output and 3 for its bottom output. As a result, the output values may be swapped, exchanged, or toggled for the same odd digital value when a switching block is configured into the first mode. This results in the top output outputting different values for two inputs having the same odd input value and similarly results in the bottom output outputting different values for two inputs having the same odd input value. Naturally, even digital values are always split evenly between outputs.

When a switching block is configured into in the second mode, the splitting circuit is configured to generate the respective first digital output and the respective second digital output according to the first splitting operation over the plurality of sampling intervals, without switching between the first splitting operation and the second splitting operation. In other words, the output values are not swapped or toggled for the same odd digital value. As a result, the top output will always output the same value for the same digital input and the bottom output will always output the same value for the same digital input. Naturally, even digital values are always split evenly between outputs.

Even splitting among two outputs of a switching block when its digital input is even may be referred to as a third splitting operation or a binary splitting operation. This occurs when the lowest significant bit of the digital input of a switching block is zero. Under this interpretation, each switching block 111, 121, 122, 131, 132, 133, and 134 includes a splitting circuit configured to split the respective digital input into a respective first digital output for the first block output terminal and a respective second digital output for the second block output terminal according to a first splitting operation, a second splitting operation that is opposite to the first splitting operation, or a third splitting operation. The second splitting operation is opposite to the first splitting operation for odd input values because the output values between the top and bottom outputs are swapped or exchanged in the manner previously described.

Accordingly, when a switching block is configured into the first mode, the splitting circuit is configured to switch between the first splitting operation, the second splitting operation, and the third splitting operation over the plurality of sampling intervals to generate the first digital output and the second digital output. In contrast, when a switching block is configured into the second mode, the splitting circuit is configured to generate the first digital output and the second digital output according to the first splitting operation and the third splitting operation over the plurality of sampling intervals. The second splitting operation is not used by a switching block when configured in the second mode. Thus, in the second mode, odd input values are split according the first splitting operation and even input values are split according to the third splitting operation.

Figure 1B:
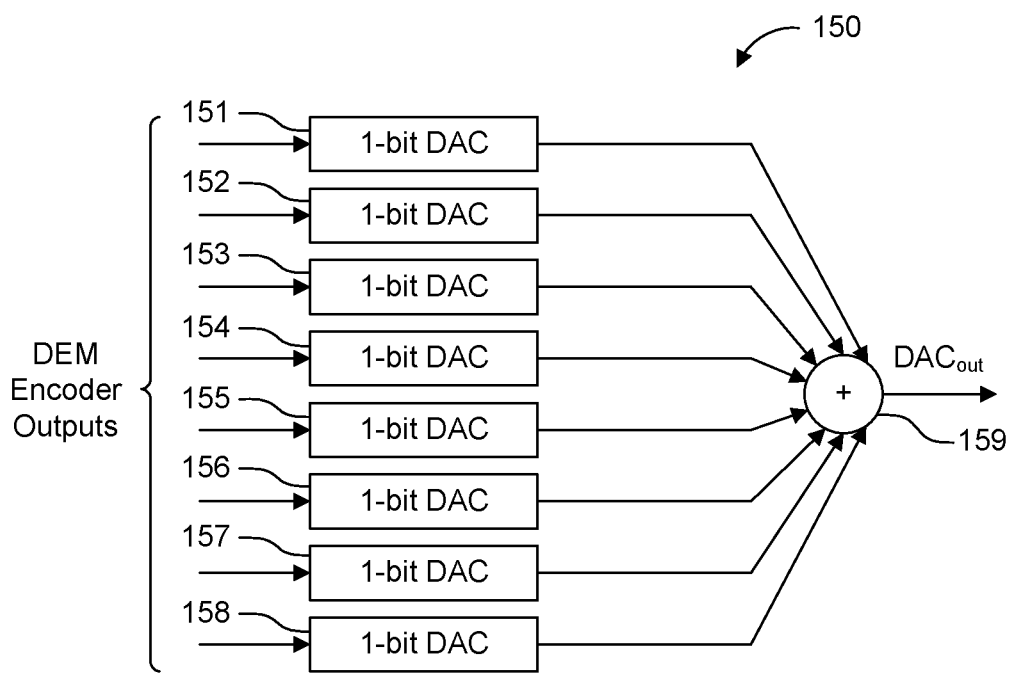
FIG. 1B is a schematic block diagram of a multi-bit digital-to-analog converter (DAC) that converts DEM encoder outputs into a DAC output according to one or more embodiments.

FIG. 1B is a schematic block diagram of a multi-bit digital-to-analog converter (DAC) 150 that converts DEM encoder outputs into a DAC output (DACout) according to one or more embodiments. The DEM encoder outputs are provided to a respective 1-bit DAC 151-158 that converts the 1-bit digital signal into a corresponding analog signal. Each analog signal is then input to an adder 159 that sums the analog signals into a summed analog signal DACout that is proportional to the digital value of the N-bit digital codeword input to the DEM encoder 100. For example, depending on the type of DAC used, the amplitude or the frequency of the DAC output is proportional to the digital value of the N-bit digital codeword.

Figure 1C:
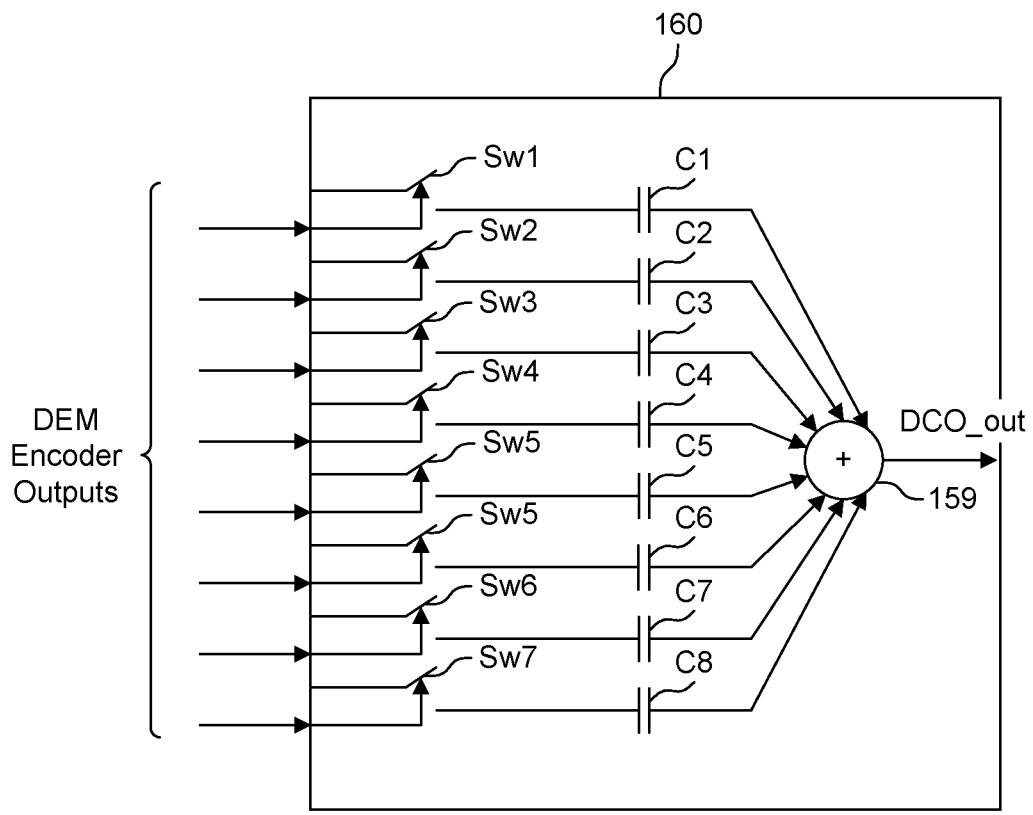
FIG. 1C is a schematic block diagram of part of a Digital-Controlled Oscillator (DCO) that receives DEM encoder outputs as control bits for generating a DCO output according to one or more embodiments.

FIG. 1C is a schematic block diagram of part of a Digital-Controlled Oscillator (DCO) 160 that receives DEM encoder outputs as control bits (i.e., control values) for generating a DCO output (DCOout) according to one or more embodiments. Each control bit controls a switch state (e.g., open or closed) of a respective switch SW1-SW7, thereby selectively coupling or decoupling a signal to be modulated to a respective capacitor C1-C8 that provides an analog signal. The outputs of the capacitors C1-C8 are coupled to an adder 169 that sums the analog signals into a summed analog signal DCOout whose frequency is proportional to the digital value of the N-bit digital codeword.

The proposed elements of the switching blocks extends the capabilities of existing techniques, such as first order shaping DEM tree by introducing the concept of programmability of individual DEM switching blocks. Such programmability allows to select, for each layer of the DEM tree, how many and which individual switching blocks are enabled for switching (i.e., toggling, equivalent to the first mode) and which ones are prevented from switching (i.e., second mode). Those switching blocks placed in the second mode merely provide a split or divide-by-2 function to maintain the properties of the binary to thermometric tree. The programming can said to be permanent for multiple codewords until the control signal swb_enable is changed.

Additionally, the proposed method allows individual switching blocks of each layer of the tree to enable or disable dithering. Dithering introduces random noise into the switching block and specifically into the toggling circuit of the switching block. This allows the right amount of dithering to be introduced to break periodic patterns.

Thus, a principle concept of the embodiments is the notion that by carefully selecting the switching blocks that are configured into the second mode, one can obtain a profile of number of transitions which can be optimized to reduce the peak number of transitions, have a less sharp shape (compared to the sharp triangular shape of traditional schemes) which calibration techniques can then cope with, while at the same time maintaining as low as possible variance compared to second order shaping DEM, and of course retaining the overall noise shaping properties.

Figure 2:
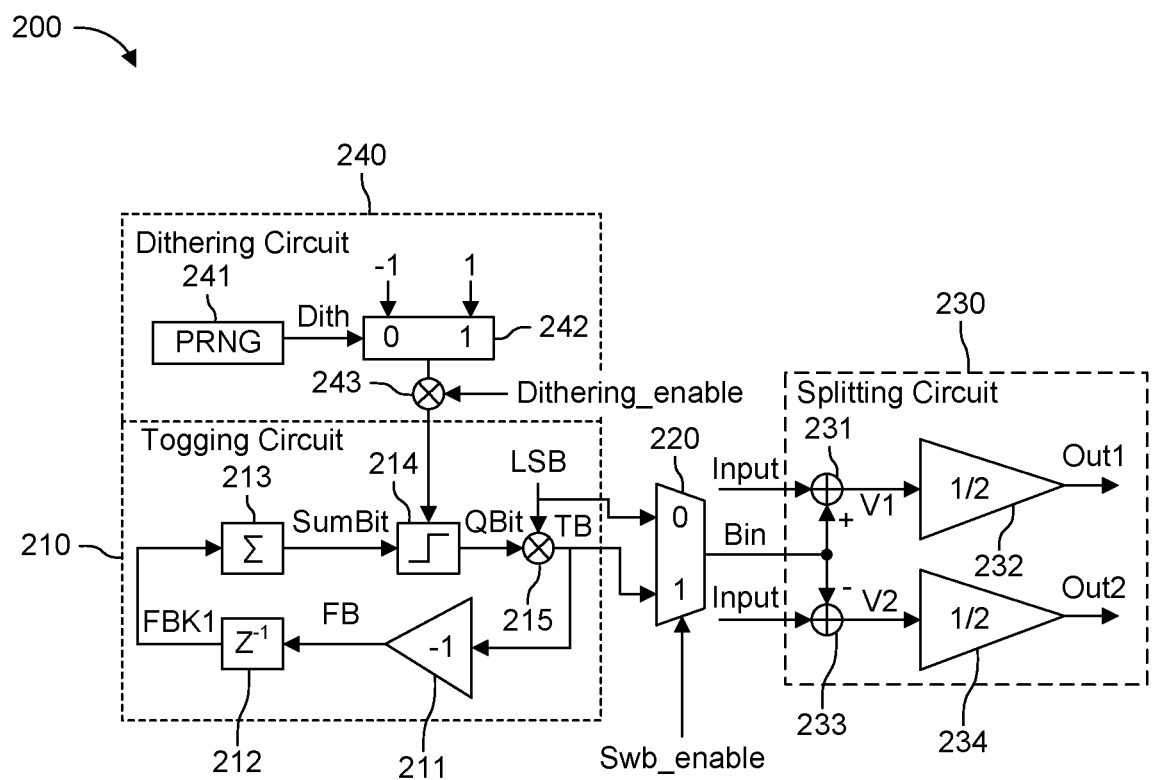
FIG. 2 is a schematic block diagram of a switching block of the DEM encoder according to one or more embodiments.

FIG. 2 is a schematic block diagram of a switching block 200 of the DEM encoder according to one or more embodiments. The switching block 200 represents the structure for each of the switching blocks 111, 121, 122, 131, 132, 133, and 134.

The switching block 200 includes a togging circuit 210 that is a first order feedback loop configured to generate the toggle bit TB (e.g., TB(t)) based on at least one previous toggle bit (e.g., TB(t-1)) and the lowest significant bit (LSB) of the current digital input of the switching block 200.

The switching block 200 further includes a programmable mode selector 220 that receives a respective first control signal swb_enable of the plurality of first control signals. The programmable mode selector 220 includes two inputs, with one receiving the LSB of the current digital input of the switching block 200 and the other receiving the toggle bit TB. The programmable mode selector 220 is configured into either the first mode (e.g., when swb_enable=1) and the second mode (e.g., when swb_enable=0). The programmable mode selector 220 passes one of its inputs to its output and ultimately to the splitting circuit 230 based on the configured mode. In this case, the programmable mode selector 220 passes the toggle bit TB to the splitting circuit 230 when configured into the first mode (e.g., when swb_enable=1) and passes the LSB to the splitting circuit 230 when configured into the second mode (e.g., when swb_enable=0). In this sense, the programmable mode selector 220 may be a two-to-one multiplexer that selectively routes one of its inputs to its output according to its respective first control signal swb_enable.

The switching block 200 further includes a splitting circuit 230 that is configured to split the respective digital input into a respective first digital output out1 for the first block output terminal and a respective second digital output out2 for the second block output terminal according to the aforementioned splitting operations. The digital input ("input") of the switching block 200 is duplicated for two parallel processing paths that each perform an arithmetic function based on the output of the programmable mode selector 220. As noted above, the output of the programmable mode selector 220 is either LSB or TB. Thus, either LSB or TB is fed into the two processing paths of the splitting circuit 230 for generating the two outputs out1 and out2.

The switching block 200 further includes a dithering circuit 240 that includes a dithering control input configured to receive a respective second control signal (dithering_enable) that indicates whether dithering is enabled or disabled for the plurality of sampling intervals for the switching block 200. For example, the dithering circuit 240 includes a pseudo random number generator (PRNG) 241, a dithering pattern generator 242, and a multiplier 243. The dithering circuit 240 is configured to inject a respective dithering pattern into the toggling circuit 210 when dithering is enabled and not inject the respective dithering pattern into the toggling circuit 210 when dithering is disabled.

The PRNG 241 is configured to generate a random sequence of bits (e.g., 1's and 0's) that is provide to the dithering pattern generator 242. The PRNG 241 is merely one example of a random binary source that could be used. The dithering pattern generator 242 may have two inputs and a single output, and thus may be a two-to-one multiplexer. The two inputs are fixed at different input values (e.g., +1 and −1) and the dithering pattern generator 242 passes one of the inputs to its output based on the most recent bit of the random sequence of bits provided by the PRNG 241. For example, if the most recent bit of the random sequence of bits is 0, the dithering pattern generator 242 passes −1 to the multiplier 243. In contrast, if the most recent bit of the random sequence of bits is 1, the dithering pattern generator 242 passes 1 to the multiplier 243.

Accordingly, the dithering pattern generator 242 generates a dithering pattern of 1's and −1's based on the random sequence of bits provided by the PRNG 241, and outputs the dithering pattern to the toggling circuit 210 on a condition that dithering is enabled. In the case that dithering is enabled by the second control signal (dithering_enable=1), the multiplier 243 multiplies the dithering pattern received from the dithering pattern generator 242 with the second control signal (dithering_enable=1) and passes the dithering pattern on to the toggling circuit 210. In other words, random noise comprising bit values of +1 and −1 is injected into to the toggling circuit 210 for further randomization of the toggling bit TB.

In contrast, in the case that dithering is disabled by the second control signal (dithering_enable=0), the multiplier 243 multiplies the dithering pattern received from the dithering pattern generator 242 with the second control signal (dithering_enable=0) and nullifies the dithering pattern. In other words, a bit value of 0 is provided to the toggling circuit 210, which does not introduce any noise into the toggling circuit 210 and, thus, does not further randomize the toggling bit TB.

Turning to the toggling circuit 210, the toggling circuit 210 is configured to generate a toggle bit TB whose value toggles during the plurality of sampling intervals. When the switching block 200 is configured in the first mode, the splitting circuit 230 is configured to receive the toggle bit TB and apply the first splitting operation or the second splitting operation according to the value of the toggle bit TB. The toggling circuit 210 includes an inverter 211 that inverts the current toggle bit TB and provides the inverted toggle bit as a feedback bit FB. The inverter 211 provides the feedback bit FB to a signal delay unit 212, which may be a shift register that stores the feedback bit FB to which a unit sample delay period ($z^{-1}$) is incurred to produce a delayed feedback bit FBK1. The signal delay unit 212 provides the delayed feedback bit FBK1 to an accumulator 213 that generated an accumulated output bit SumBit via a summation of terms. The accumulator 213 provides the accumulated output bit SumBit to a quantizer 214 that clips the accumulated output bit SumBit to either 1 or −1 to generate a quantized bit Qbit that has a value of is either +1 or −1. The quantizer 214 also receives the output of the multiplier 243 which may randomize the value of the quantized bit Qbit (i.e., randomize the value of 1 or −1).

The quantizer 214 provides the quantized bit Qbit to a multiplier 215 that multiplies the quantized bit Qbit (i.e., 1 or −1) with the LSB of the digital input to generate the toggle bit TB. As a result, the toggle bit TB toggles between 1, 0, and −1 depending on a LSB of the respective digital input. When the digital value is odd (i.e., LSB=1), the multiplier 215 will pass the value of the quantized bit Qbit (i.e., randomize the value of 1 or −1) as the value of the toggle bit TB. When the digital value is even (i.e., LSB=0), the value of the toggle bit TB will be 0. The splitting circuit 230 performs is splitting operation based on the value of its input bit Bin, which is either +1, −1, or 0. Accordingly, the splitting circuit 230 performs a first splitting operation when its input bit Bin is +1, a second splitting operation when its input bit Bin is −1, and a third splitting operation (i.e., binary splitting) when its input bit Bin is 0. As noted above, the third splitting operation results in an equal divide between the first output out1 and the second output out2 due to the fact that the digital input has an even value (i.e., LSB=0). The first and second splitting operations may be considered "opposite" because either the absolute value of its input bit Bin is either added to or subtracted from the digital input before it is divided in half.

The splitting circuit 230 include a first processing path that includes adder 231 and divider 232 and a second processing path that includes subtractor 233 and divider 234. The adder 231 adds input bit Bin to the digital input ("input") to generate a first value V1 that is divided in half by the divider 232 to generate the first output out1. However, because the input bit Bin may have a value of +1 or −1, the adder 231 behaves like a subtractor when the input bit Bin is −1 and thereby would subtract "1" from the input to produce the first value V1.

The subtractor 233 subtracts input bit Bin from the digital input ("input") to generate a second value V2 that is divided in half by the divider 234 to generate the second output out2. However, because the input bit Bin may have a value of −1, the subtractor 233 behaves like an adder when the input bit Bin is −1 and thereby would add "1" to the input to produce the second value V2. Accordingly, the adder 231 and the subtractor 233 perform opposite arithmetic operations depending on whether the input bit Bin is +1 or −1 and are configured to exchange arithmetic operations when the input bit Bin switches from +1 to −1 or vice versa.

Therefore, it can be said that the first splitting operation includes adding 1 to the respective digital input to generate a first value at V1 and dividing the first value by 2 to generate the respective first digital output out1, and the first splitting operation further includes subtracting 1 from the respective digital input to generate a second value at V2 and dividing the second value by 2 to generate the respective second digital output out2. Moreover, the second splitting operation includes subtracting 1 from the respective digital input to generate a third value at V1 and dividing the third value by 2 to generate the respective first digital output out1, and the second splitting operation further includes adding 1 to the respective digital input to generate a fourth value at V2 and dividing the fourth value by 2 to generate the respective second digital output out2.

When in the second mode, the splitting circuit 230 is configured to receive the LSB instead of the toggle bit as its input bit Bin, and when in the first mode, the splitting circuit 230 is configured to receive the toggle bit instead of the LSB as its input bit Bin. When configured into the second mode, the splitting circuit 230 is configured to apply the first splitting operation using the LSB at the input bit Bin to generate the respective first digital output out1 and the respective second digital output out2.

The splitting circuit 230 is configured to perform a third splitting operation when the LSB of the respective digital input is 0, including splitting the respective digital input evenly into the respective first digital output out1 and the respective second digital output out2. For example, when in the first mode, the splitting circuit 230 is configured to receive the toggle bit TB, add 1 to the respective digital input when the toggle bit TB is 1 to generate the first value V1, add 0 to the respective digital input when the toggle bit is 0 to generate the first value V1, subtract 1 from the respective digital input when the toggle bit is 1 to generate the second value V2, and subtract 0 from the respective digital input when the toggle bit is 0 to generate the second value V2. When in the second mode, the splitting circuit 230 is configured to receive the LSB of the respective digital input, add 1 to the respective digital input when the LSB is 1 to generate the first value V2, add 0 to the respective digital input when the LSB is 0 to generate the first value V1, subtract 1 from the respective digital input when the LSB is 1 to generate the second value V2, and subtract 0 from the respective digital input when the LSB is 0 to generate the second value V2.

Figure 3A:
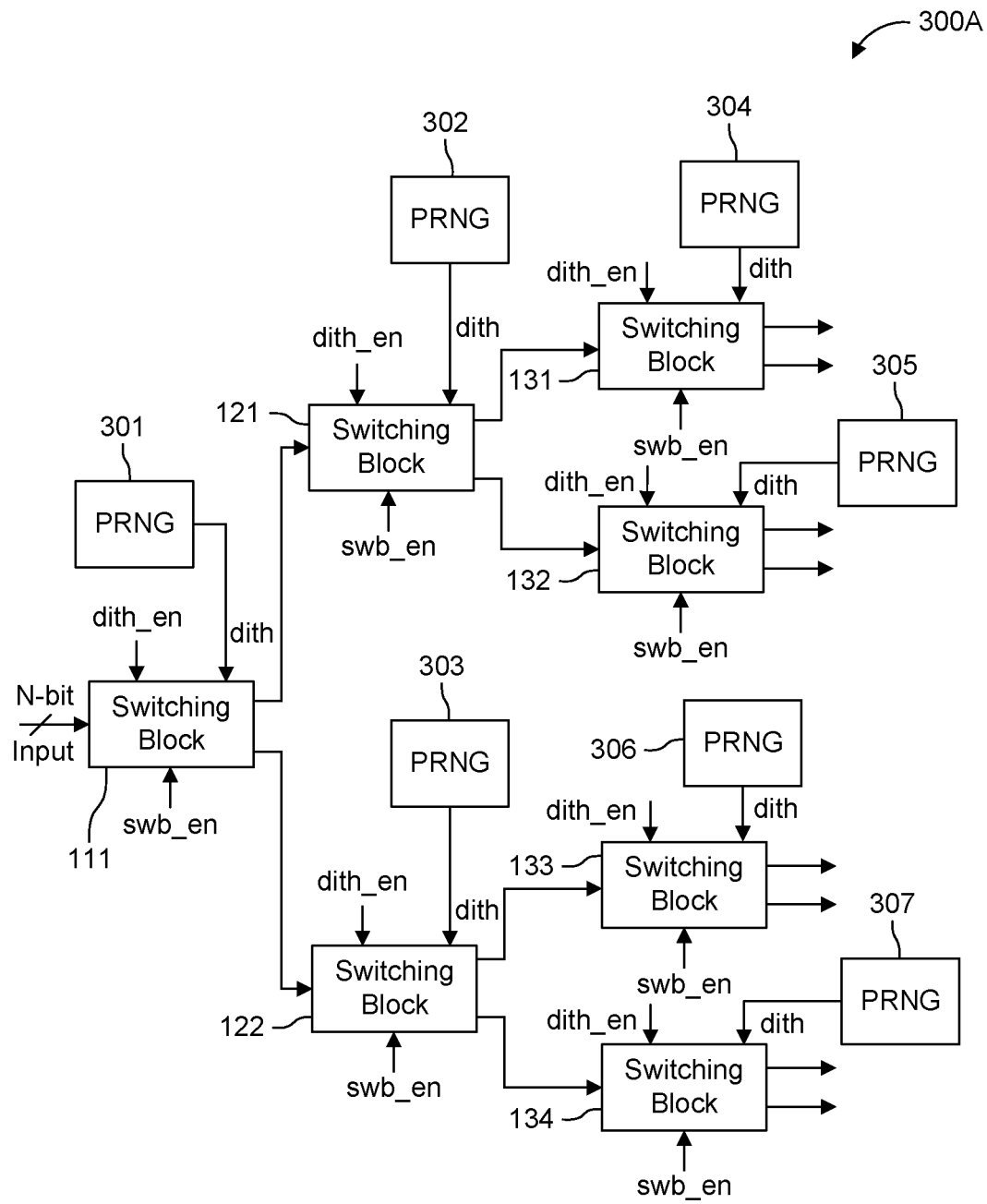
FIG. 3A is a schematic block diagram of the DEM encoder of FIG. 1A with a randomization network of pseudo randomizers according to one or more embodiments.
Figure 3B:
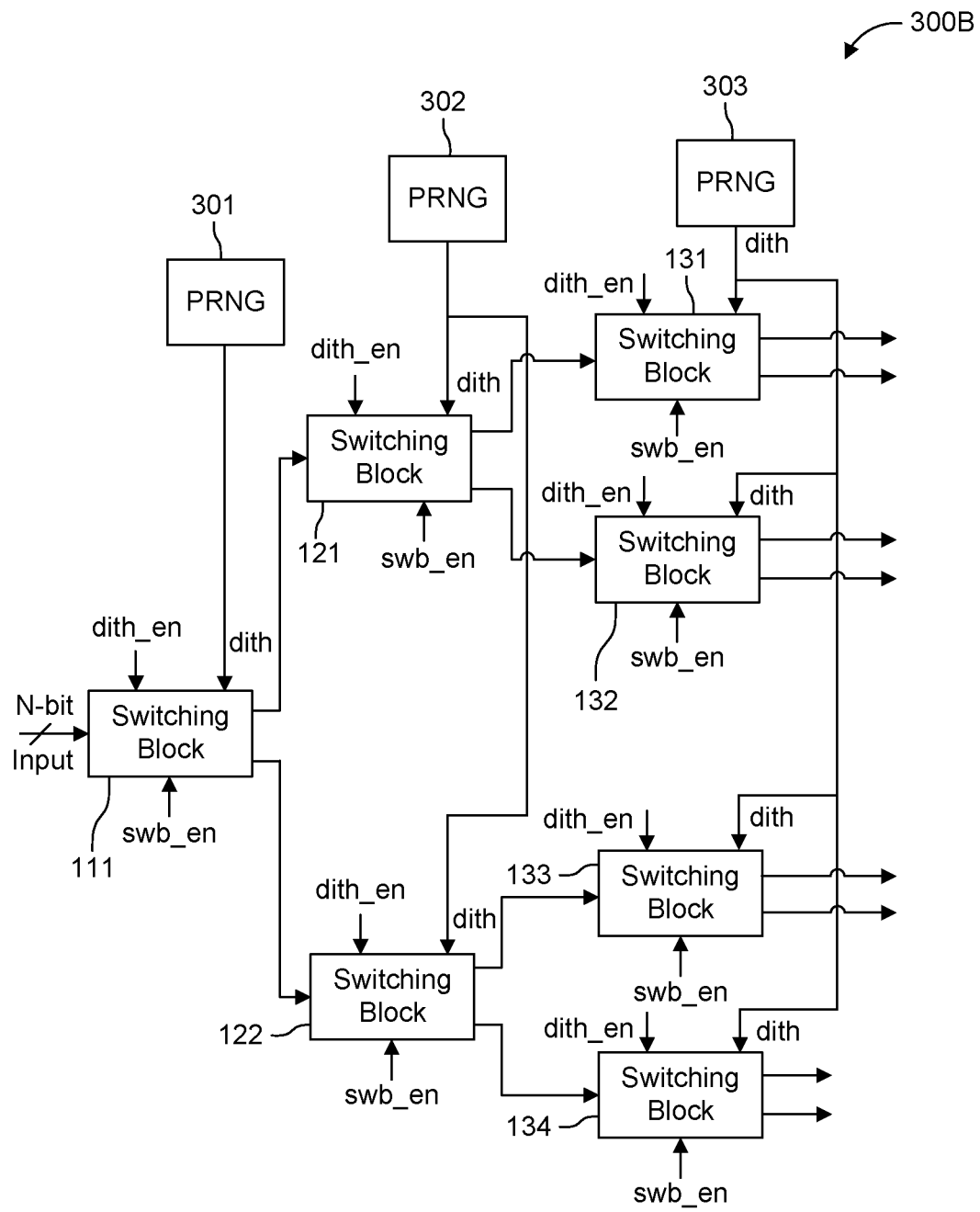
FIG. 3B is a schematic block diagram of the DEM encoder of FIG. 1A with a randomization network of pseudo randomizers according to one or more embodiments.
Figure 3C:
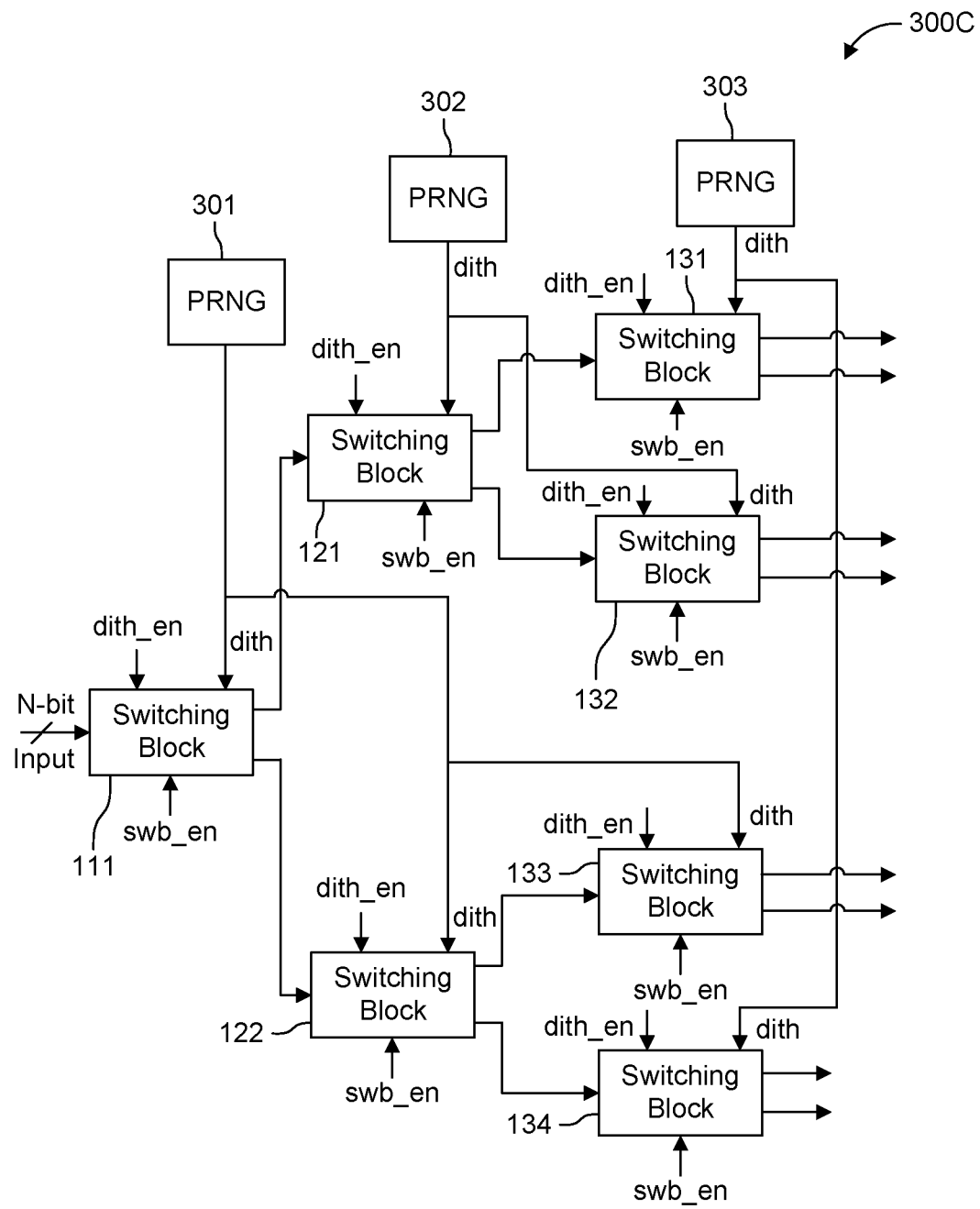
FIG. 3C is a schematic block diagram of the DEM encoder of FIG. 1A with a randomization network of pseudo randomizers according to one or more embodiments.

In other to provide dithering, a network of random number generators can be provided. FIG. 3A is a schematic block diagram of the DEM encoder 300A with a first randomization network of pseudo randomizers according to one or more embodiments. FIG. 3B is a schematic block diagram of the DEM encoder 300B with a second randomization network of pseudo randomizers according to one or more embodiments. FIG. 3C is a schematic block diagram of the DEM encoder 300C with a third randomization network of pseudo randomizers according to one or more embodiments. The DEM encoders 300A, 300B, and 300C each have the binary switching tree 101 shown in FIG. 1A.

The first randomization network of pseudo randomizers of FIG. 3A includes a plurality of PRNGs 301-307 that each generate a respective random sequence of bits (0's and 1's) to be provided to a dithering pattern generator 242 of a corresponding switching block. In this configuration, the PRNGs 301-307 are coupled one-to-one to a corresponding switching block. Thus, a number of the plurality of random number generators 301-307 is equal to a number of the plurality of switching blocks 111, 121, 122, 131, 132, 133, and 134, and each switching block is connected to a different random number generator of the plurality of random number generators such that the plurality of random number generators and the plurality of switching blocks are connected on a one-to-one basis. Thus, each dithering pattern generator 242 of the switching blocks 111, 121, 122, 131, 132, 133, and 134 is independently (i.e., uncorrelated) randomized by its respective PRNG.

The second randomization network of pseudo randomizers of FIG. 3B includes a plurality of PRNGs 301-303 that each generate a respective random sequence of bits (0's and 1's) to be provided to a dithering pattern generator 242 of a corresponding switching block. In this configuration, the PRNGs 301-303 are coupled to respective switching blocks on a layer-by-layer basis. That is, PRNG 301 is coupled to all switching blocks in the first layer of the binary switching tree 101 (i.e., switching block 111) for providing a random sequence of bits thereto, PRNG 302 is coupled to all switching blocks in the second layer of the binary switching tree 101 (i.e., switching blocks 121 and 122) for providing a random sequence of bits thereto, and PRNG 303 is coupled to all switching blocks in the third layer of the binary switching tree 101 (i.e., switching blocks 131-134) for providing a random sequence of bits thereto. Thus, the switching blocks located in the same layer will produce the same dithering pattern, whereas switching blocks located in different layer will produce different dithering patterns.

The second randomization network of pseudo randomizers of FIG. 3C includes a plurality of PRNGs 301-303 that each generate a respective random sequence of bits (0's and 1's) to be provided to a dithering pattern generator 242 of a corresponding switching block. In this configuration, the PRNGs 301-303 are coupled to respective switching blocks on a randomized basis. That is, PRNG 301 is coupled to switching blocks 111, 122, and 133 for providing a random sequence of bits thereto, PRNG 302 is coupled to switching blocks 121 and 132 for providing a random sequence of bits thereto, and PRNG 303 is coupled to switching blocks 131 and 134 for providing a random sequence of bits thereto. Thus, which switching blocks that produce same or different (i.e., correlated or uncorrelated) dithering patterns can be randomized throughout the layers of the binary switching tree 101.

In FIGS. 3B and 3C, the number of the plurality of random number generators is less than a number of the plurality of switching blocks, wherein the plurality of random number generators includes a first random number generator connected to a first subset of switching blocks of the plurality of switching blocks for transmitting a first random sequence thereto, and the plurality of random number generators includes a second random number generator connected to a second subset of switching blocks of the plurality of switching blocks for transmitting a second random sequence thereto, wherein the first subset of switching blocks and the second subset of switching blocks are mutually exclusive.

These different configurations of randomization network of pseudo randomizers provide a trade-off between required area for multiple random number generators for the dithering, and benefits seen from uncorrelated dithering sequences. The more independence between random number generators from switching block to switching block, the less variance (hence noise) is introduced in the profile of number of transitions.

Figure 4A:
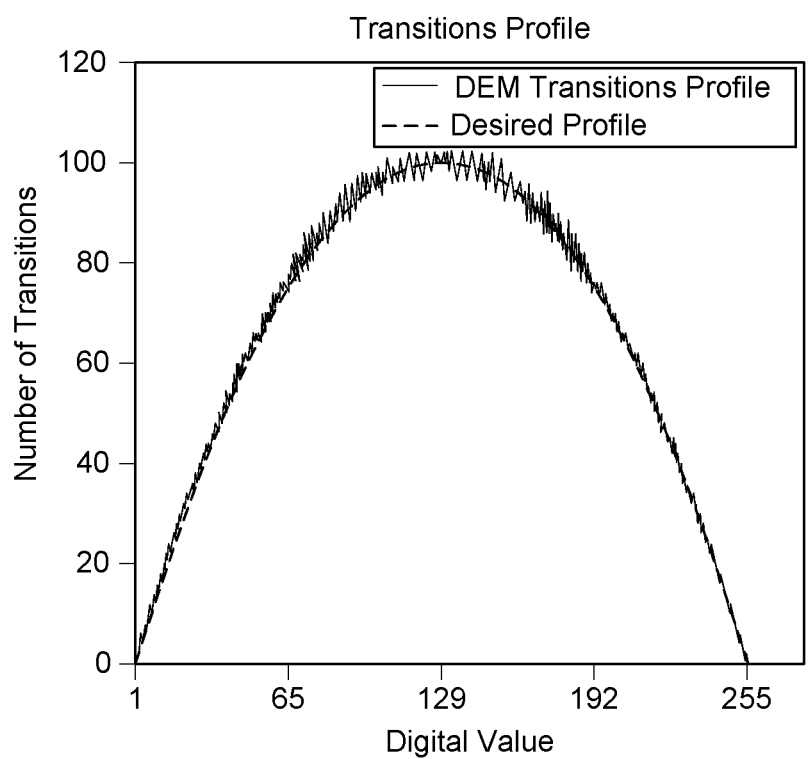
FIG. 4A is a diagram of a smooth transition profile for a first order shaping DEM tree according to one or more embodiments.

FIG. 4A is a diagram of a smooth transition profile for a first order shaping DEM tree according to one or more embodiments. In other words, the number of switching blocks configured into the first mode and their location within the binary switching tree 101 have been selected such that the pattern of the number of transitions versus the input N-bit digital codeword is smooth and, in this case, also parabolic.

Figure 4B:
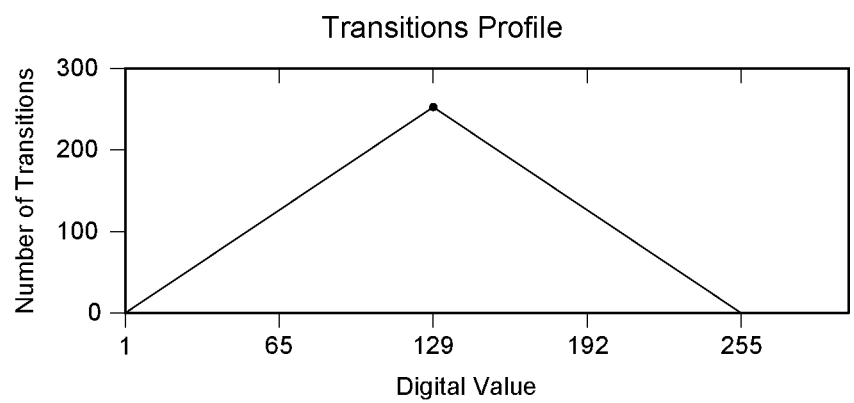
FIG. 4B is a diagram of a sharp transition profile for a first order shaping DEM tree according to one or more embodiments.

FIG. 4B is a diagram of a sharp transition profile for a first order shaping DEM tree according to one or more embodiments. In this example, all switching blocks of the binary switching tree 101 are configured into the first mode. Thus, the pattern of the number of transitions versus the input N-bit digital codeword is triangular. Not only is the pattern sharp at its peak, but the number of transitions at a digital value of 128 is much higher than that of the profile shown in FIG. 4A. Thus, the pattern can be shaped by selectively configuring a first subset of the switching blocks into the first mode and a second subset of the switching blocks into the second mode. Other profile shapes are possible and entirely configurable using this technique.

The techniques described in this disclosure may be implemented, at least in part, in hardware, software, firmware, or any combination thereof. For example, various aspects of the described techniques may be implemented within one or more processors, including one or more microprocessors, digital signal processors (DSPs), application-specific integrated circuits (ASICs), field programmable logic arrays (FPGAs), programmable logic controller (PLC), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit including hardware may also perform one or more of the techniques of this disclosure. A control unit may use electrical signals and digital algorithms to perform its receptive, analytic, and control functions, which may further include corrective functions. Such hardware, software, and firmware may be implemented within the same device or within separate devices to support the various techniques described in this disclosure.

One or more aspects of the present disclosure may be implemented as a non-transitory computer-readable recording medium having recorded thereon a program embodying methods/algorithms for instructing the processor to perform the methods/algorithms. Thus, a non-transitory computer-readable recording medium may have electronically readable control signals stored thereon, which cooperate (or are capable of cooperating) with a programmable computer system such that the respective methods/algorithms are performed. The non-transitory computer-readable recording medium can be, for example, a RAM, a ROM, a PROM, an EPROM, an EEPROM, a FLASH memory, or an electronic memory device.

While various embodiments have been disclosed, it will be apparent to those skilled in the art that various changes and modifications can be made which will achieve some of the advantages of the concepts disclosed herein without departing from the spirit and scope of the invention. It is to be understood that other embodiments may be utilized and structural or logical changes may be made without departing from the scope of the present invention. It should be mentioned that features explained with reference to a specific figure may be combined with features of other figures, even in those not explicitly mentioned. Such modifications to the general inventive concept are intended to be covered by the appended claims and their legal equivalents.

Furthermore, the following claims are hereby incorporated into the detailed description, where each claim may stand on its own as a separate example embodiment. While each claim may stand on its own as a separate example embodiment, it is to be noted that—although a dependent claim may refer in the claims to a specific combination with one or more other claims—other example embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent on the independent claim.

It is further to be noted that methods disclosed in the specification or in the claims may be implemented by a device having means for performing each of the respective acts of these methods. For example, the techniques described in this disclosure may be implemented, at least in part, in hardware, software, firmware, or any combination thereof, including any combination of a computing system, an integrated circuit, and a computer program on a non-transitory computer-readable recording medium. For example, various aspects of the described techniques may be implemented within one or more processors, including one or more microprocessors, DSPs, ASICs, or any other equivalent integrated or discrete logic circuitry, as well as any combinations of such components.

Further, it is to be understood that the disclosure of multiple acts or functions disclosed in the specification or in the claims may not be construed as to be within the specific order. Therefore, the disclosure of multiple acts or functions will not limit these to a particular order unless such acts or functions are not interchangeable for technical reasons. Furthermore, in some embodiments, a single act may include or may be broken into multiple sub acts. Such sub acts may be included and part of the disclosure of this single act unless explicitly excluded.

What is claimed is:

1. A dynamic element matching (DEM) encoder configured to convert an N-bit digital codeword into a pattern of 1-bit values, wherein N is an integer greater than one, the DEM encoder comprising:
    a binary switching tree comprising an encoder input configured to receive the N-bit digital codeword and a plurality of encoder outputs, wherein each encoder output is configured to output one 1-bit value of the pattern of 1-bit values,
    wherein the binary switching tree comprises a plurality of switching blocks interconnected between the encoder input and the plurality of encoder outputs,
    wherein the plurality of switching blocks is configured to receive a plurality of first control signals such that each switching block receives a respective first control signal of the plurality of first control signals and is independently programmable based on the respective first control signal,
    wherein each switching block of the plurality of switching blocks includes a block input terminal, a first block output terminal, a second block output terminal, and a switching control input terminal configured to receive the respective first control signal configured to program a respective switching block into a first mode or second mode for a plurality of sampling intervals,
    wherein the block input terminal is configured to receive a respective digital input derived from the N-bit digital codeword,
    wherein each switching block includes a splitting circuit configured to split the respective digital input into a respective first digital output for the first block output terminal and a respective second digital output for the second block output terminal according to a first splitting operation or a second splitting operation that is different from the first splitting operation, wherein, in the first mode the splitting circuit is configured to switch between the first splitting operation and the second splitting operation over the plurality of sampling intervals to generate the respective first digital output and the respective second digital output, and wherein, in the second mode, the splitting circuit is configured to generate the respective first digital output and the respective second digital output according to the first splitting operation over the plurality of sampling intervals, without switching between the first splitting operation and the second splitting operation.

2. The DEM encoder of claim 1, wherein:

each switching block includes a toggling circuit configured to generate a toggle bit whose value toggles during the plurality of sampling intervals, and when in the first mode, the splitting circuit is configured to receive the toggle bit and apply the first splitting operation or the second splitting operation according to the value of the toggle bit.

3. The DEM encoder of claim 2, wherein:

the splitting circuit is configured to receive the toggle bit when in the first mode and receive a lowest significant bit (LSB) of the respective digital input when in the second mode, and when in the second mode, the splitting circuit is configured to apply the first splitting operation using the LSB to generate the respective first digital output and the respective second digital output.

4. The DEM encoder of claim 3, wherein:

when in the second mode, the splitting circuit is configured to receive the LSB instead of the toggle bit, and when in the first mode, the splitting circuit is configured to receive the toggle bit instead of the LSB.

5. The DEM encoder of claim 1, further comprising:

a controller configured to generate the plurality of first control signals to selectively program a first subset of switching blocks of the plurality of switching blocks into the first mode for the plurality of sampling intervals and selectively program a second subset of switching blocks of the plurality of switching blocks into the second mode for the plurality of sampling intervals in order to shape a profile of a number of transitions versus N-bit digital codewords.

6. The DEM encoder of claim 5, wherein the controller is configured to program the first subset of switching blocks into the first mode and selectively program the second subset of switching blocks into the second mode such that the shape of the profile of the number of transitions versus the N-bit digital codewords is smooth.

7. The DEM encoder of claim 1, wherein:

the first splitting operation includes adding 1 to the respective digital input to generate a first value and dividing the first value by 2 to generate the respective first digital output, the first splitting operation further includes subtracting 1 from the respective digital input to generate a second value and dividing the second value by 2 to generate the respective second digital output, the second splitting operation includes subtracting 1 from the respective digital input to generate a third value and dividing the third value by 2 to generate the respective first digital output, and the second splitting operation further includes adding 1 to the respective digital input to generate a fourth value and dividing the fourth value by 2 to generate the respective second digital output.

8. The DEM encoder of claim 7, wherein each switching block includes a toggling circuit configured to generate a toggle bit that toggles between 1, 0, and −1 depending on a lowest significant bit (LSB) of the respective digital input, wherein, when in the first mode, the splitting circuit is configured to receive the toggle bit and apply the first splitting operation when the toggle bit is 1 and apply the second splitting operation when the toggle bit is −1.

9. The DEM encoder of claim 8, wherein the splitting circuit of each switching block is configured to perform a third splitting operation when the LSB of the respective digital input is 0, including splitting the respective digital input evenly into the respective first digital output and the respective second digital output.

10. The DEM encoder of claim 8, wherein, when in the first mode, the splitting circuit is configured to receive the toggle bit, add 1 to the respective digital input when the toggle bit is 1 to generate the first value, add 0 to the respective digital input when the toggle bit is 0 to generate the first value, subtract 1 from the respective digital input when the toggle bit is 1 to generate the second value, and subtract 0 from the respective digital input when the toggle bit is 0 to generate the second value.

11. The DEM encoder of claim 7, wherein:

when in the second mode, the splitting circuit is configured to receive a lowest significant bit (LSB) of the respective digital input, add 1 to the respective digital input when the LSB is 1 to generate the first value, add 0 to the respective digital input when the LSB is 0 to generate the first value, subtract 1 from the respective digital input when the LSB is 1 to generate the second value, and subtract 0 from the respective digital input when the LSB is 0 to generate the second value.

12. The DEM encoder of claim 8, wherein the toggling circuit is a first order feedback loop configured to generate the toggle bit based on at least one previous toggle bit and the LSB.

13. The DEM encoder of claim 2, wherein:

the plurality of switching blocks is configured to receive a plurality of second control signals such that each switching block receives a respective second control signal of the plurality of second control signals and is programmable based on the respective second control signal, each switching block includes a dithering circuit including a dithering control input configured to receive the respective second control signal that indicates whether dithering is enabled or disabled for the plurality of sampling intervals for that switching block, and the dithering circuit is configured to inject a respective dithering pattern into the toggling circuit when dithering is enabled and not inject the respective dithering pattern into the toggling circuit when dithering is disabled.

14. The DEM encoder of claim 13, further comprising:

a controller configured to generate the plurality of second control signals to concurrently selectively enable dithering at a first subset of switching blocks of the plurality of switching blocks over the plurality of sampling intervals and selectively disable dithering at a second subset of switching blocks of the plurality of switching blocks over the plurality of sampling intervals.

15. The DEM encoder of claim 13, further comprising:
a plurality of random number generators configured to generate a plurality of random sequences, wherein each dithering circuit is configured to receive a respective random sequence of the plurality of random sequences, generate the respective dithering pattern based on the respective random sequence, and output the respective dithering pattern to the toggling circuit on a condition that dithering is enabled.

16. The DEM encoder of claim 15, wherein a number of the plurality of random number generators is equal to a number of the plurality of switching blocks, and each switching block is connected to a different random number generator of the plurality of random number generators such that the plurality of random number generators and the plurality of switching blocks are connected on a one-to-one basis.

17. The DEM encoder of claim 15, wherein:
a number of the plurality of random number generators is less than a number of the plurality of switching blocks, wherein the plurality of random number generators includes a first random number generator connected to a first subset of switching blocks of the plurality of switching blocks for transmitting a first random sequence thereto, and
the plurality of random number generators includes a second random number generator connected to a second subset of switching blocks of the plurality of switching blocks for transmitting a second random sequence thereto, wherein the first subset of switching blocks and the second subset of switching blocks are mutually exclusive.

18. The DEM encoder of claim 1, wherein the plurality of encoder outputs is configured to output the pattern of 1-bit values to at least one of a Digital-to-Analog Converter (DAC) or a Digital-controlled Oscillator (DCO).

19. A dynamic element matching (DEM) encoder configured to convert an N-bit digital codeword into a pattern of 1-bit values, wherein N is an integer greater than one, the DEM encoder comprising:
a binary switching tree comprising an encoder input configured to receive the N-bit digital codeword and a plurality of encoder outputs, wherein each encoder output is configured to output one 1-bit value of the pattern of 1-bit values,
wherein the binary switching tree comprises a plurality of switching blocks interconnected between the encoder input and the plurality of encoder outputs,
wherein the plurality of switching blocks is configured to receive a plurality of first control signals such that each switching block receives a respective first control signal of the plurality of first control signals and is programmable based on the respective first control signal,
wherein each switching block of the plurality of switching blocks includes a block input terminal, a first block output terminal, and a second block output terminal,
wherein the block input terminal is configured to receive a respective digital input derived from the N-bit digital codeword,
wherein each switching block includes a splitting circuit configured to split the respective digital input into a respective first digital output for the first block output terminal and a respective second digital output for the second block output terminal according to a first splitting operation or a second splitting operation that is different from the first splitting operation,
wherein each switching block includes a toggling circuit configured to generate a toggle bit whose value toggles during the plurality of sampling intervals, wherein the splitting circuit is configured to receive the toggle bit and apply the first splitting operation or the second splitting operation according to the value of the toggle bit,
wherein each switching block includes a dithering circuit including a dithering control input terminal configured to receive the respective first control signal that indicates whether dithering is enabled or disabled for the plurality of sampling intervals for that switching block, and
wherein the dithering circuit is configured to inject a respective dithering pattern into the toggling circuit when dithering is enabled and refrain from injecting the respective dithering pattern into the toggling circuit when dithering is disabled.

20. The DEM encoder of claim 19, further comprising:
a controller configured to generate the plurality of first control signals to selectively enable dithering at a first subset of switching blocks of the plurality of switching blocks over the plurality of sampling intervals and selectively disable dithering at a second subset of switching blocks of the plurality of switching blocks over the plurality of sampling intervals.

21. The DEM encoder of claim 19, further comprising:
a plurality of random number generators configured to generate a plurality of random sequences, wherein each dithering circuit is configured to receive a respective random sequence of the plurality of random sequences, generate the respective dithering pattern based on the respective random sequence, and output the respective dithering pattern to the toggling circuit on a condition that dithering is enabled.

22. The DEM encoder of claim 21, wherein a number of the plurality of random number generators is equal to a number of the plurality of switching blocks, and each switching block is connected to a different random number generator of the plurality of random number generators such that the plurality of random number generators and the plurality of switching blocks are connected on a one-to-one basis.

23. The DEM encoder of claim 21, wherein:
a number of the plurality of random number generators is less than a number of the plurality of switching blocks, wherein the plurality of random number generators includes a first random number generator connected to a first subset of switching blocks of the plurality of switching blocks for transmitting a first random sequence thereto, and
the plurality of random number generators includes a second random number generator connected to a second subset of switching blocks of the plurality of switching blocks for transmitting a second random sequence thereto, wherein the second subset of switching blocks is different from the first subset of switching blocks.

24. A dynamic element matching (DEM) encoder configured to convert an N-bit digital codeword into a pattern of 1-bit values, wherein N is an integer greater than one, the DEM encoder comprising:
a binary switching tree comprising an encoder input configured to receive the N-bit digital codeword and a plurality of encoder outputs, wherein each encoder output is configured to output one 1-bit value of the pattern of 1-bit values, wherein the binary switching tree comprises a plurality of switching blocks interconnected between the encoder input and the plurality of encoder outputs, wherein the plurality of switching blocks is configured to receive a plurality of first control signals such that each switching block receives a respective first control signal of the plurality of first control signals and is independently programmable based on the respective first control signal, wherein each switching block of the plurality of switching blocks includes a block input terminal, a first block output terminal, a second block output terminal, and a switching control input terminal configured to receive the respective first control signal configured to program a respective switching block into a first mode or second mode for a plurality of sampling intervals, wherein the block input terminal is configured to receive a respective digital input derived from the N-bit digital codeword, wherein each switching block includes a splitting circuit configured to split the respective digital input into a respective first digital output for the first block output terminal and a respective second digital output for the second block output terminal according to a first splitting operation, a second splitting operation that is opposite to the first splitting operation, or a third splitting operation, wherein, when in the first mode, the splitting circuit is configured to switch between the first splitting operation, the second splitting operation, and the third splitting operation over the plurality of sampling intervals to generate the first digital output and the second digital output, and wherein, when in the second mode, the splitting circuit is configured to generate the first digital output and the second digital output according to the first splitting operation and the third splitting operation over the plurality of sampling intervals.

25. The DEM encoder of claim 24, wherein:

in the first mode, the splitting circuit is configured to receive a toggle bit and apply the first splitting operation, the second splitting operation, or the third splitting operation based on the toggle bit to generate the first digital output and the second digital output, and in the second mode, the splitting circuit is configured to receive a lowest significant bit (LSB) of the respective digital input and apply the first splitting operation or the third splitting operation based on the LSB to generate the first digital output and the second digital output.

26. The DEM encoder of claim 24, wherein the plurality of encoder outputs is configured to output the pattern of 1-bit values to at least one of a Digital-to-Analog Converter (DAC) or a Digital-controlled Oscillator (DCO).

* * * * *